US012604573B2

(12) United States Patent
Lin et al.

(10) Patent No.: US 12,604,573 B2
(45) Date of Patent: Apr. 14, 2026

(54) DEVICE CONFIGURED TO BOND AN ELECTRONIC COMPONENT, METHOD FOR BONDING AN ELECTRONIC COMPONENT, AND METHOD FOR MANUFACTURING A LIGHT-EMITTING DIODE DISPLAY

(71) Applicant: Micraft System Plus Co., Ltd., Taoyuan City (TW)

(72) Inventors: Chingju Lin, Taoyuan City (TW); Sheng-Che Huang, Taoyuan City (TW); Shao-Wei Huang, Taoyuan City (TW)

(73) Assignee: Micraft System Plus Co., Ltd., Taoyuan City (TW)

( * ) Notice: Subject to any disclaimer, the term of this patent is extended or adjusted under 35 U.S.C. 154(b) by 437 days.

(21) Appl. No.: 18/340,894

(22) Filed: Jun. 26, 2023

(65) Prior Publication Data

US 2024/0006564 A1     Jan. 4, 2024

Related U.S. Application Data

(60) Provisional application No. 63/358,166, filed on Jul. 4, 2022.

(30) Foreign Application Priority Data

Jul. 28, 2022    (TW) .................................. 111128335

(51) Int. Cl.
H10H 20/85        (2025.01)
H10W 90/00       (2026.01)

(52) U.S. Cl.
CPC ........ H10H 20/8506 (2025.01); H10W 90/00 (2026.01)

(58) Field of Classification Search
CPC .. H10H 20/8506; H10H 20/01; H10H 20/018; H10W 90/00; H10P 10/00;
(Continued)

(56) References Cited

U.S. PATENT DOCUMENTS

| | | | | |
|---|---|---|---|---|
| 2002/0069961 A1* | 6/2002 | Kobayashi | ................ | B30B 5/02 |
| | | | | 156/382 |
| 2006/0081332 A1* | 4/2006 | Kang | ................... | B41J 11/0085 |
| | | | | 156/391 |

(Continued)

FOREIGN PATENT DOCUMENTS

| | | |
|---|---|---|
| TW | 200721567 | 6/2007 |
| TW | I335682 | 1/2011 |

OTHER PUBLICATIONS

"Notice of allowance of Taiwan Counterpart Application", issued on Mar. 6, 2024, p. 1-p. 4.

(Continued)

*Primary Examiner* — Andrew L Swanson
(74) *Attorney, Agent, or Firm* — JCIPRNET

(57)     ABSTRACT
A device configured to bond an electronic component includes a carrying platform, a pressing element, a closed space generating mechanism, a gas extracting mechanism, and an energy generating mechanism. The carrying platform is configured to carry a target substrate and a carrying substrate carrying the electronic component on the target substrate. The pressing element is made of a flexible material. The closed space generating mechanism is capable of putting the pressing element onto the carrying platform, so as to form a closed space between the pressing element and the carrying platform. The gas extracting mechanism is configured to extract gas from the closed space. The energy generating mechanism is disposed near the carrying platform, and configured to generate energy toward the carrying platform. A method for bonding an electronic component (Continued)

and a method for manufacturing a light-emitting diode (LED) display are also provided.

8 Claims, 6 Drawing Sheets

(58) Field of Classification Search
     CPC ...... H10P 10/12; H10P 10/126; H10P 10/128;
                                              H10P 10/14
     See application file for complete search history.

(56)                      References Cited

U.S. PATENT DOCUMENTS

| | | | |
|---|---|---|---|
| 2006/0150381 A1* | 7/2006 | Anzai ................. | H03H 9/1085 |
| | | | 29/25.35 |
| 2007/0111117 A1* | 5/2007 | Noh ................... | B41M 5/38207 |
| | | | 430/41 |
| 2014/0033518 A1* | 2/2014 | Ito .......................... | H05K 3/305 |
| | | | 29/739 |
| 2020/0211879 A1* | 7/2020 | Lee ..................... | H01L 21/6835 |
| 2020/0373176 A1* | 11/2020 | Priewasser .......... | H01L 21/3043 |

OTHER PUBLICATIONS

"Office Action of Taiwan Counterpart Application", issued on Aug. 29, 2023, p. 1-p. 5.

* cited by examiner

DEVICE CONFIGURED TO BOND AN ELECTRONIC COMPONENT, METHOD FOR BONDING AN ELECTRONIC COMPONENT, AND METHOD FOR MANUFACTURING A LIGHT-EMITTING DIODE DISPLAY

CROSS-REFERENCE TO RELATED APPLICATION

This application claims the priority benefits of U.S. provisional application Ser. No. 63/358,166, filed on Jul. 4, 2022, and Taiwan application serial no. 111128335, filed on Jul. 28, 2022. The entirety of each of the above-mentioned patent applications is hereby incorporated by reference herein and made a part of this specification.

BACKGROUND

Technical Field

The disclosure relates to a device for connecting electronic components, a method for connecting electronic components, and a method for manufacturing a display, and particularly relates to a device configured to bond an electronic component, a method for bonding an electronic component, and a method for manufacturing a light-emitting diode (LED) display.

Description of Related Art

Semiconductor components are typically grown on a growth substrate using epitaxy. However, with the various applications of semiconductor components, the semiconductor components may not necessarily remain on the original growth substrate when they are finally produced, but may be transferred to a transfer substrate and then to a target substrate to form a final product.

When transferring the semiconductor component from the transfer substrate to the target substrate, a method is to make the front sides of the transfer substrate and the target substrate to face each other and press the transfer substrate and the target substrate together.

Micro light-emitting diodes (micro-LEDs) are the future trend of the display industry, and the technology of transferring micro-LED chips from the transfer substrate to the target substrate is used in their production process. Currently, this industry mainly produces small-sized and medium-sized displays, but considering future development, it is bound to develop toward large-sized displays.

The challenge for large-sized displays in the future lies in large-area pressing accuracy, laser form, production yield, selection of related materials, and repair methods for defective pixels. Therefore, research and development of production equipment for large-sized displays is also imperative.

SUMMARY

An embodiment of the disclosure proposes a device configured to bond an electronic component. The device includes a carrying platform, a pressing element, a closed space generating mechanism, a gas extracting mechanism, and an energy generating mechanism. The carrying platform is configured to carry a target substrate and a carrying substrate carrying the electronic component on the target substrate. The pressing element is made of a flexible material. The closed space generating mechanism is capable of putting the pressing element onto the carrying platform, so as to form a closed space between the pressing element and the carrying platform. The gas extracting mechanism is configured to extract gas from the closed space. The energy generating mechanism is disposed near the carrying platform, and configured to generate energy toward the carrying platform.

An embodiment of the disclosure proposes a method for bonding an electronic component, which includes providing a carrying substrate having a surface on which the electronic component to be bonded is disposed; providing a target substrate having a bonding surface; arranging the carrying substrate and the target substrate in a way that the carrying substrate faces the target substrate and the electronic component to be bonded is in contact with the bonding surface of the target substrate; enclosing the carrying substrate and the target substrate thus arranged in a closed space which is formed by an elastomer; generating a negative pressure in the closed space, thereby making the elastomer press on either the carrying substrate or the target substrate of the carrying substrate and the target substrate thus arranged; and applying an energy beam onto the carrying substrate or the target substrate to bond the electronic component on the target substrate from the carrying substrate.

An embodiment of the disclosure proposes a method for manufacturing an LED display, which includes using the above method to bond an electronic component, and the electronic component is an LED chip.

DESCRIPTION OF THE EMBODIMENTS

Figure 1:
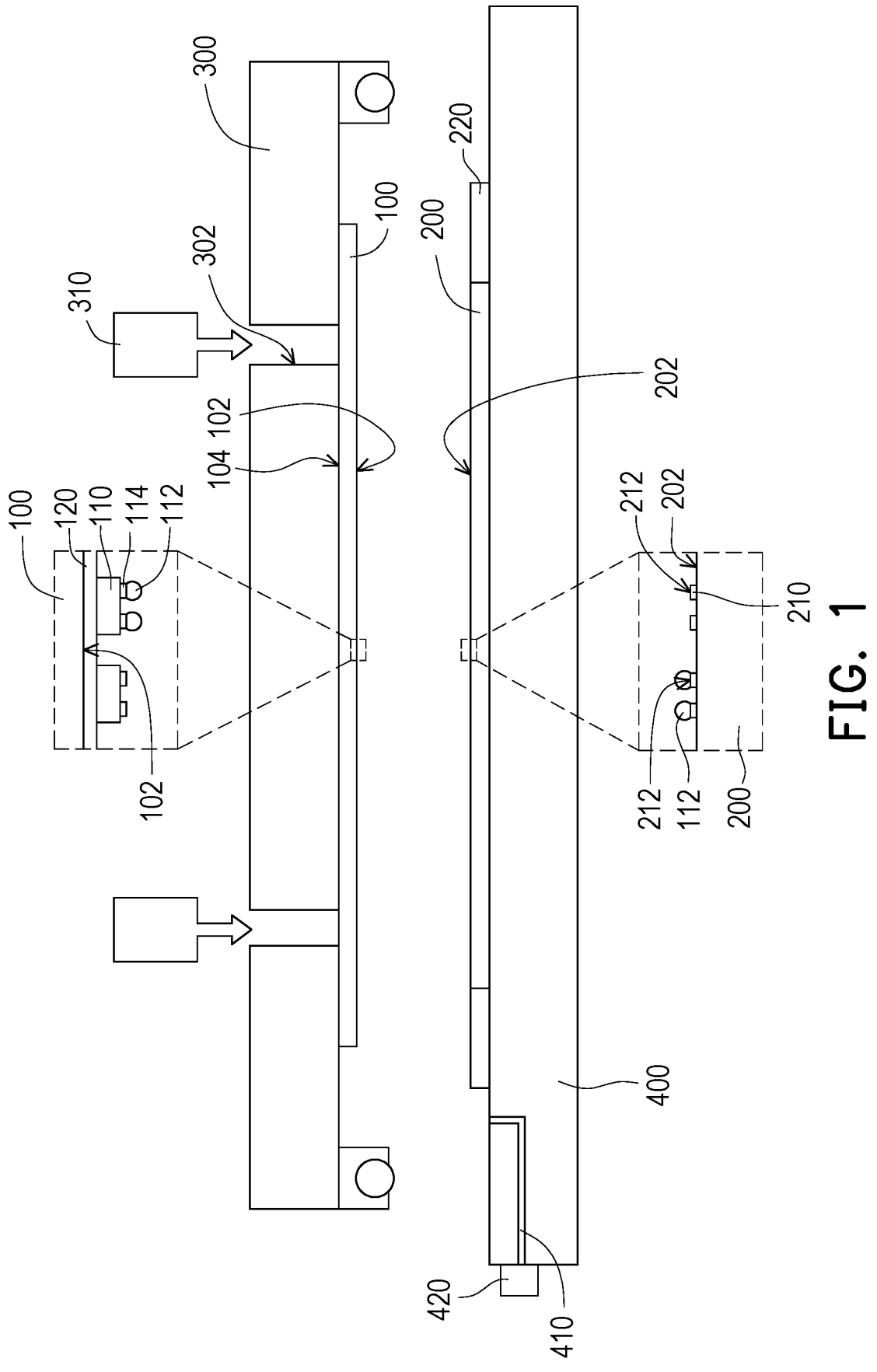
FIG. 1 to FIG. 5 are cross-sectional schematic views illustrating a process of a method for bonding an electronic component according to an embodiment of the disclosure.
Figure 2:
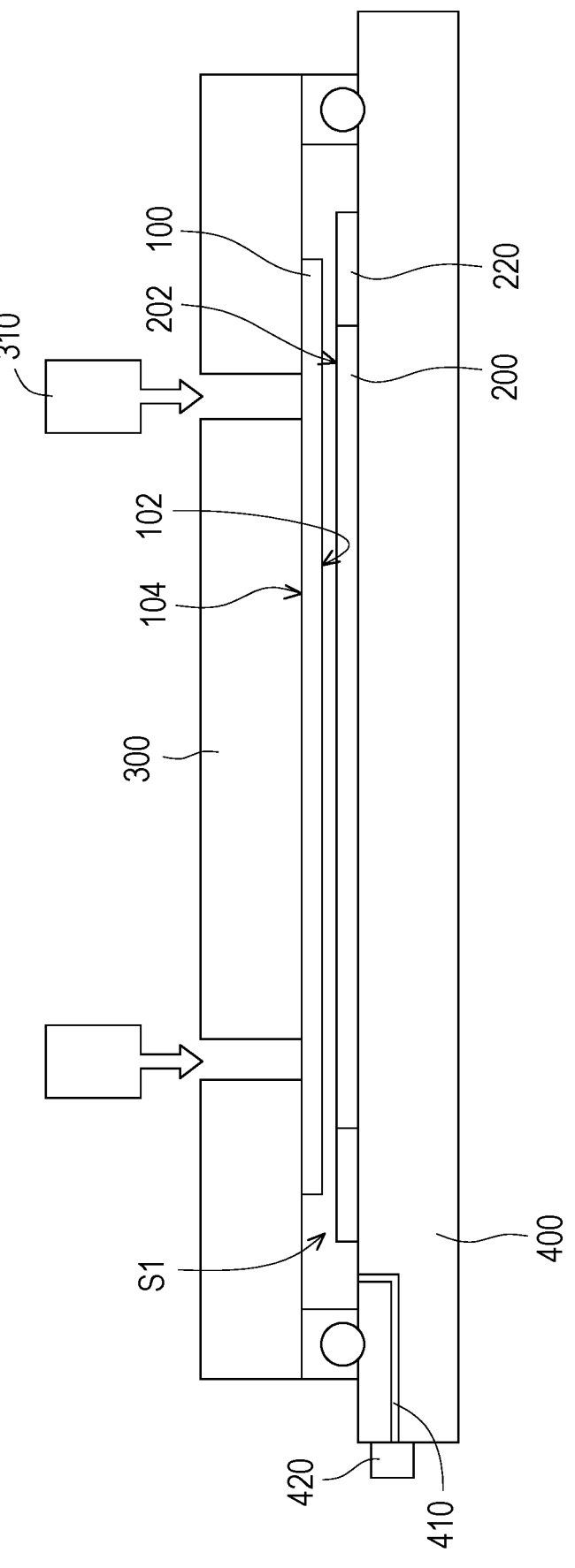

FIG. 1 to FIG. 5 are cross-sectional schematic views illustrating a process of a method for bonding an electronic component according to an embodiment of the disclosure. Referring to FIG. 1 to FIG. 5, the method for bonding the electronic component in this embodiment includes the following steps. First, referring to FIG. 1, a carrying substrate 100 is provided, and the carrying substrate 100 has a surface 102 on which an electronic component 110 to be bonded is disposed. In this embodiment, the electronic component 110 optionally having a solder 112 thereon is carried on the surface 102 of the carrying substrate 100. In this embodiment, the carrying substrate 100 is, for example, a glass substrate or a transparent substrate of other materials. However, in other embodiments, the carrying substrate 100 may also be a metal substrate or an opaque substrate of other materials. In an embodiment, multiple electronic components 110 may be fixed on the carrying substrate 100 through an adhesive layer 120. In this embodiment, the electronic component 110 is, for example, a light-emitting diode (LED) chip or other electronic components, which has at least one bonding pad 114, and the solder 112 is disposed on the bonding pad 114.

In addition, a target substrate 200 is provided, which has a bonding surface 202, and the bonding surface 202 has a desired bonding position 212. When no solder 112 is on the electronic component 110, the solder 112 is applied to the desired bonding position 212. In this embodiment, the target substrate 200 is a thin film transistor (TFT) substrate, and the bonding surface 202 thereof is disposed with a bonding pad 210 connected to a conductive circuit of the TFT substrate, and a surface of the bonding pad 210 forms the desired bonding position 212. In other embodiments, the target substrate 200 may also be a silicon substrate, a circuit board, or other suitable substrates.

Afterward, the carrying substrate 100 and the target substrate 200 are arranged in a way that the carrying substrate 100 faces the target substrate 200 and the electronic component 110 to be bonded is in contact with the bonding surface 202 of the target substrate 200. In this embodiment, the surface 102 of the carrying substrate 100 carrying the electronic component 110 is made to face the bonding surface 202 of the target substrate 200, so that the electronic component 110 is opposite to the desired bonding position 212. In this embodiment, an adsorption platform 300 adsorbs the carrying substrate 100, for example, by a method of vacuum adsorption, to absorb a surface 104 of the carrying substrate 100 not carrying the electronic component 110. The surface 104 is opposite to the surface 102. In addition, in this embodiment, an image sensor 310 senses an alignment mark on the carrying substrate 100 through a through hole 302 of the adsorption platform 300, and senses an alignment mark of the target substrate 200 thereunder through the carrying substrate 100, so as to align the electronic component 110 with the desired bonding position 212.

Figure 3:
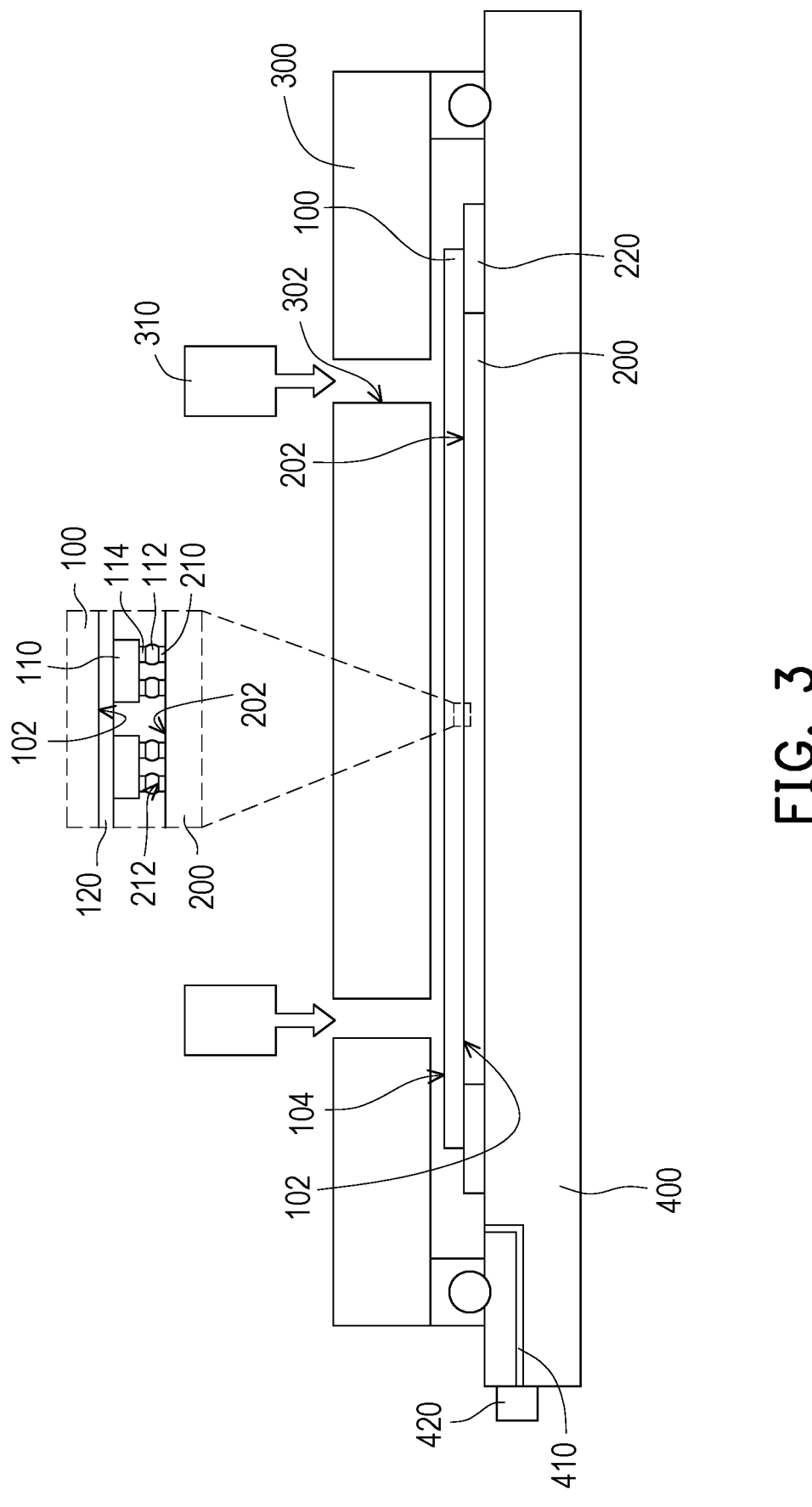

Next, the adsorption platform 300 is put on a carrying platform 400 configured to carry the target substrate 200 to form a closed space S1 between the adsorption platform 300 and the carrying platform 400. Then, gas is extracted from the closed space S1, for example, to perform vacuum extraction. In this embodiment, the carrying platform 400 has a gas exhausting channel 410. The gas exhausting channel 410 includes an end connected to the closed space S1, and another end connected to a gas extracting mechanism 420, such as a gas extracting pump. The gas extracting mechanism 420 extracts the gas in the closed space S1 to the outside of the closed space S1 through the gas exhausting channel 410 to achieve a vacuum state in the closed space S1. When the closed space S1 is performed vacuum extraction, the gravity of the carrying substrate 100 is greater than an adsorption force of the adsorption platform 300, causing the carrying substrate 100 to fall onto the target substrate 200 and leading to the vacuum relief in the closed space S1, as illustrated in FIG. 3. In this embodiment, when the carrying substrate 100 falls onto the target substrate 200 and faces the target substrate 200, the electronic component 110 contacts the desired bonding position 212 of the target substrate 200 through the solder 112.

Figure 4:
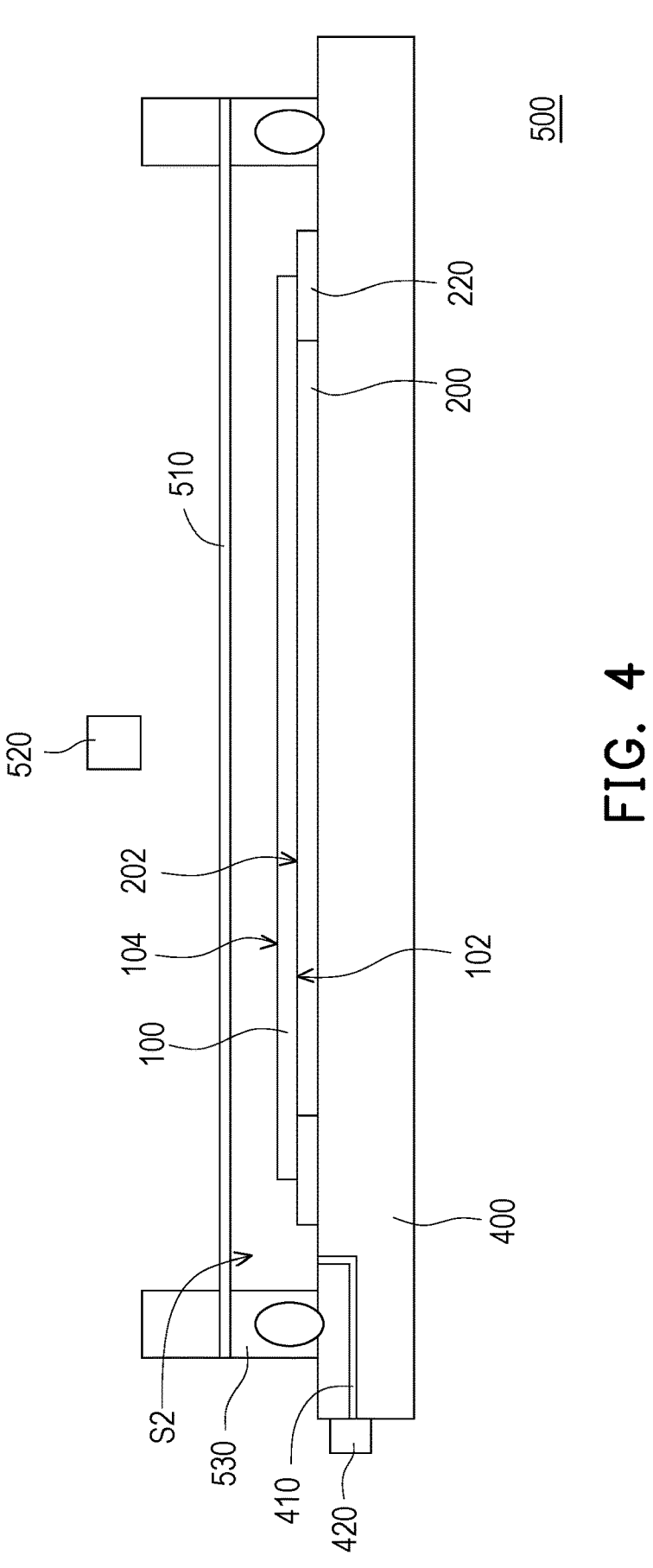

Afterward, referring to FIG. 4, the carrying substrate 100 and the target substrate 200 thus arranged are enclosed in a closed space S2 which is formed by an elastomer (i.e. a pressing element 510). In the closed space 2, an end surface of the closed space S2 near the carrying substrate 100 is made of the elastomer, i.e., the pressing element 510 having flexible material. In this embodiment, the pressing element 510 is a flexible film, such as a silicone film. Next, referring to FIG. 5, a negative pressure is generated in the closed space S2, thereby making the elastomer press on either the carrying substrate 100 or the target substrate 200 of the carrying substrate 100 and the target substrate 200 thus arranged. In an embodiment, vacuum extraction is performed to the closed space S2, so that the end surface made of the elastomer (i.e., the pressing element 510) is pressed on the surface 104 of the carrying substrate 100 not carrying the electronic component 110. At this time, due to the significant decrease in air pressure in the closed space S2, the atmospheric pressure above the pressing element 510 causes the pressing element 510 to deform and abut against the surface 104 of the carrying substrate 100 to apply pressure evenly to the carrying substrate 100. In addition, when the pressing element 510 presses on the surface 104 of the carrying substrate 100, an energy beam 522 is applied onto the carrying substrate 100 or the target substrate 200 to bond the electronic component 110 on the target substrate 200 from the carrying substrate 100. In this embodiment, the energy beam 522 is applied to melt the solder 112 so that the electronic component 110 is bonded and fixed to the desired bonding position 212. In this embodiment, the energy beam 522 is, for example, a laser beam. However, in other embodiments, the energy beam 522 may also be thermal energy or a non-coherent beam (i.e., a non-laser beam). In this embodiment, the solder 112 is provided on either the electronic component 110 to be bonded or the bonding surface 202 of the target substrate 200, prior to applying the energy beam 552. Moreover, in an embodiment, the elastomer is made by the negative pressure to press on the carrying substrate 100. However, in another embodiment, the elastomer is made by the negative pressure to press on the target substrate 200.

Figure 5:
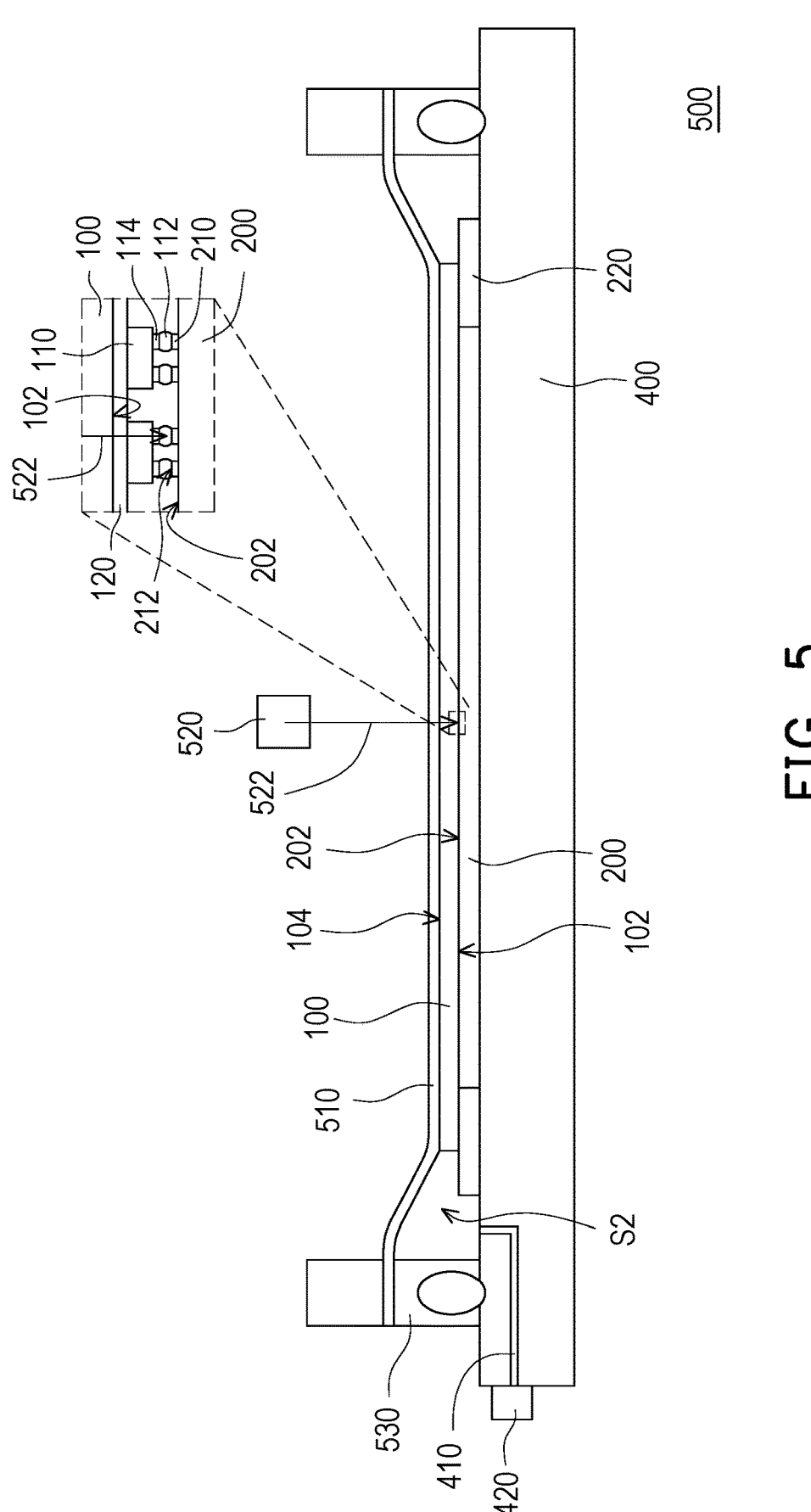

Please refer to FIG. 4 and FIG. 5. An embodiment of the disclosure proposes a device 500 configured to bond an electronic component, which includes the carrying platform 400, the pressing element 510, a closed space generating mechanism 530, the gas extracting mechanism 420, and an energy generating mechanism 520. The carrying platform 400 is configured to carry the target substrate 200 and the carrying substrate 100 carrying the electronic component 110 on the target substrate 200. The closed space generating mechanism 530 is capable of putting the pressing element 510 onto the carrying platform 400, so as to form the closed space S2 between the pressing element 510 and the carrying platform 400. The gas extracting mechanism 420 is configured to extract gas from the closed space S2. In this embodiment, the gas extracting mechanism 420 extracts gas through the carrying platform 400, for example, by extracting gas from the closed space S2 through the gas exhausting channel 410 in the carrying platform 400.

Figure 6:
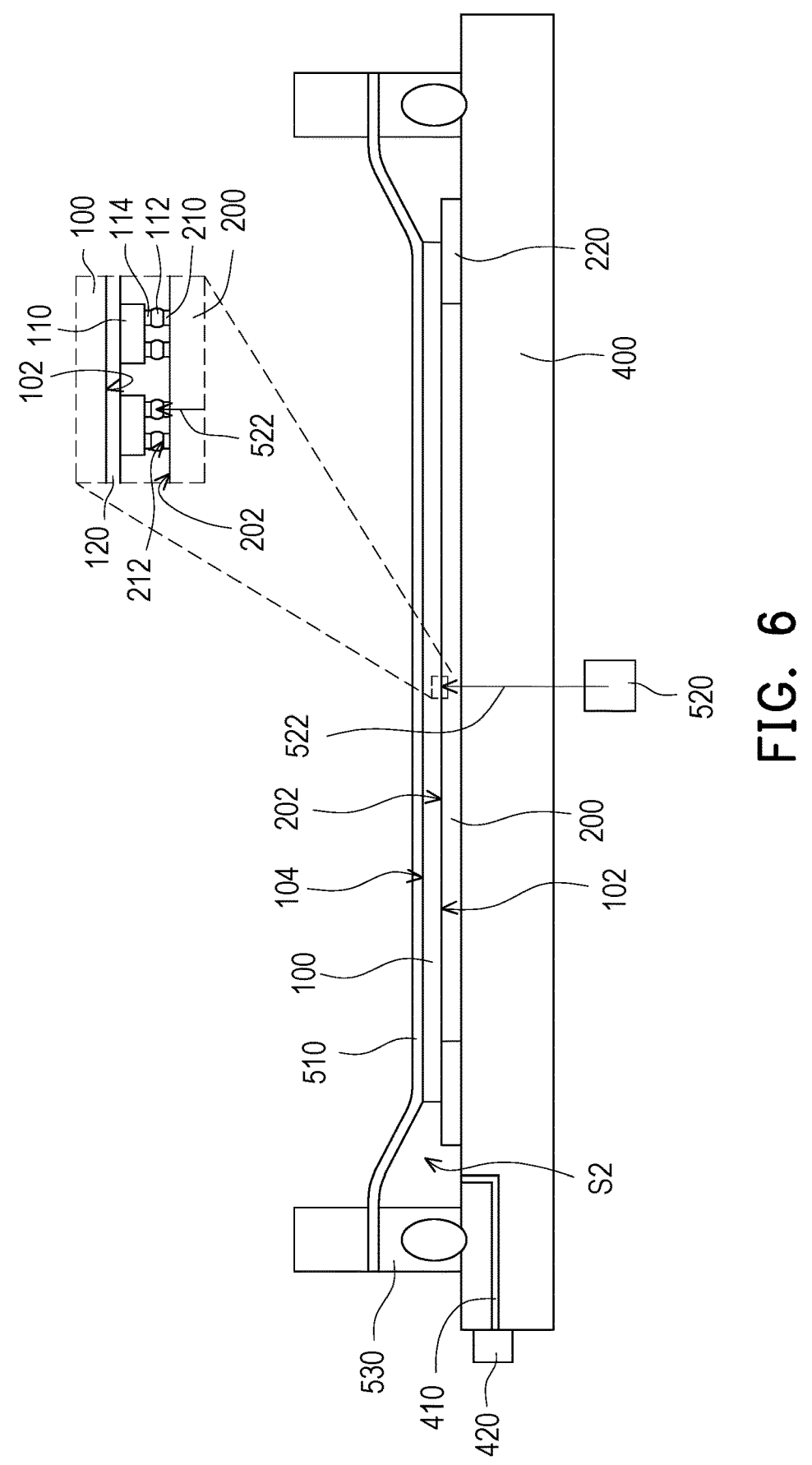
FIG. 6 is a cross-sectional schematic view of a device configured to bond an electronic component according to another embodiment of the disclosure.

The energy generating mechanism 520 is disposed near the carrying platform 400, and configured to generate energy (e.g. the energy beam 522) toward the carrying platform 400. In this embodiment, the energy generating mechanism 520 is a laser generator configured to provide the energy beam 522 (a laser beam in this embodiment). The energy generating mechanism 520 may move laterally to scan different electronic components 110. Alternatively, in another embodiment, the energy generating mechanism 520 may provide a large cross-sectional energy beam to simultaneously irradiate multiple electronic components 110. However, in other embodiments, the energy generating mechanism 520 may also be a heater or a non-coherent light source. In this embodiment, the laser generator (i.e., the energy generating mechanism 520) emits the laser beam (i.e., the energy beam 522) toward the carrying platform 400 and travelling through the pressing element 510 to melt the solder 112. However, in another embodiment, as shown in FIG. 6, the laser generator (i.e., the energy generating mechanism 520) emits the laser beam (i.e., the energy beam 522) toward the carrying platform 400 and travelling through the carrying platform 400 to melt the solder 112. The carrying platform 400 may be penetrated by the laser beam or have a window that may be penetrated by the laser beam.

The method for bonding an electronic component shown in FIG. 1 to FIG. 5 or FIG. 6 may also be used as a method for manufacturing an LED display, in which the electronic component 110 is an LED, such as a micro-LED, and the target substrate 200 is used as the display substrate for the final product. The electronic component 110 (i.e. the LED) is disposed on the target substrate 200 and electrically connected to the target substrate 200. After the electronic component 110 is bonded to the target substrate 200, the adhesive layer 120 and the carrying substrate 100 may be removed, and the target substrate 200 left and the electronic component 110 thereon become the LED display.

In the device 500 configured to bond an electronic component, the method for bonding an electronic component, and the method for manufacturing an LED display, since an elastomer is adopted in combination with a method of extracting gas from the closed space S2, the two substrates can be evenly pressed together to achieve a good bonding result, thereby improving the yield of manufacturing an LED displays. In operations in FIG. 2 to FIG. 3, by performing vacuum extraction to the closed space S1, the carrying substrate 100 falls onto the target substrate 200, so that a bubble space is hardly formed between the carrying substrate 100 and the target substrate 200, which affects the manufacturing yield. In the operation in FIG. 5, by adopting a method of performing vacuum extraction to the closed space S2, the pressing element 510 is evenly pressed against the carrying substrate 100 under the atmospheric pressure. Since a method of the negative pressure is adopted, the load on the equipment may not consider the pressing load. Since the pressing element maintains evenly pressing force on the carrying substrate 100 when the electronic component 110 is bonded and fixed to the target substrate 200 by using the energy beam 522, a good bonding quality can be achieved.

In addition, in this embodiment, the area of the carrying substrate 100 is larger than the area of the target substrate 200, so a dummy sheet 220 may be placed around the target substrate 200. In this way, when the carrying substrate 100 falls onto the target substrate 200, the dummy sheet 220 may support edges of the carrying substrate 100 to prevent the edges of the carrying substrate 100 from bending. However, in another embodiment, when the area of the carrying substrate 100 is smaller than or equal to the area of the target substrate 200, the dummy sheet 220 may not be needed to place around the target substrate 200.

In summary, in the device configured to bond an electronic component, the method for bonding an electronic component, and the method for manufacturing an LED display of the disclosure, since an elastomer or a pressing element is adopted in combination with a method of extracting gas from the closed space, the target substrate and the carrying substrate can be evenly pressed together to achieve a good bonding result, thereby improving the yield of manufacturing an LED display.

What is claimed is:

1. A method for bonding an electronic component, comprising:
   providing a carrying substrate having a surface on which the electronic component to be bonded is disposed;
   providing a target substrate having a bonding surface;
   arranging the carrying substrate and the target substrate in a way that the carrying substrate faces the target substrate and the electronic component to be bonded is in contact with the bonding surface of the target substrate;
   enclosing the carrying substrate and the target substrate thus arranged in a closed space which is formed by an elastomer;
   generating a negative pressure in the closed space, thereby making the elastomer press on either the carrying substrate or the target substrate of the carrying substrate and the target substrate thus arranged; and
   applying an energy beam onto the carrying substrate or the target substrate to bond the electronic component on the target substrate from the carrying substrate.

2. The method according to claim 1, further comprising providing a solder on either the electronic component to be bonded or the bonding surface of the target substrate, prior to applying the energy beam.

3. The method according to claim 1, wherein the energy beam is a laser beam.

4. The method according to claim 1, wherein the energy beam is applied to travel through the carrying substrate.

5. The method according to claim 4, wherein the elastomer is made by the negative pressure to press on the carrying substrate.

6. The method according to claim 4, wherein the elastomer is made by the negative pressure to press on the target substrate.

7. The method according to claim 1, wherein the electronic component is a light-emitting diode (LED) chip.

8. A method for manufacturing an LED display, comprising using the method according to claim 7 to bond the LED chip.

* * * * *